(12) United States Patent
Yoon et al.

(10) Patent No.: US 7,535,778 B2
(45) Date of Patent: May 19, 2009

(54) SEMICONDUCTOR MEMORY DEVICE WITH MEMORY CELLS, EACH HAVING BIT REGISTERING LAYER IN ADDITION TO A MEMORY LAYER AND METHOD OF DRIVING THE SAME

(75) Inventors: Hong-Sik Yoon, Seongnam-si (KR); In-Seok Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 91 days.

(21) Appl. No.: 11/365,585

(22) Filed: Mar. 2, 2006

(65) Prior Publication Data

US 2007/0064507 A1 Mar. 22, 2007

(30) Foreign Application Priority Data

Sep. 16, 2005 (KR) ........................ 10-2005-0086689

(51) Int. Cl.
 *G11C 29/00* (2006.01)
 *G11C 7/00* (2006.01)
(52) U.S. Cl. .................. 365/200; 365/97; 365/151; 365/185.03; 977/712
(58) Field of Classification Search ............ 365/151 X, 365/200 O, 97 X, 185.03 X, 151, 200, 97, 365/185.03; 977/700, 712 X, 712
See application file for complete search history.

(56) References Cited

U.S. PATENT DOCUMENTS

| | | | |
|---|---|---|---|
| 6,016,269 A | 1/2000 | Peterson et al. | |
| 6,026,013 A * | 2/2000 | Peterson | ............... 365/175 |
| 6,483,734 B1 * | 11/2002 | Sharma et al. | ................ 365/97 |
| 6,549,457 B1 * | 4/2003 | Srinivasan et al. | ..... 365/185.03 |
| 6,587,394 B2 | 7/2003 | Hogan | |
| 6,591,394 B2 | 7/2003 | Lee et al. | |
| 6,750,471 B2 | 6/2004 | Bethune et al. | |
| 6,868,022 B2 | 3/2005 | Scheuerlein et al. | |
| 6,936,233 B2 | 8/2005 | Smalley et al. | |
| 7,000,156 B2 * | 2/2006 | Shimada et al. | ............. 714/711 |
| 2006/0034137 A1 * | 2/2006 | Zanardi | ...................... 365/200 |

* cited by examiner

*Primary Examiner*—VanThu Nguyen
(74) *Attorney, Agent, or Firm*—Harness, Dickey & Pierce

(57) ABSTRACT

The semiconductor memory device includes a memory layer having a plurality of memory cells for storing data, and at least one bit registering layer for recording status information on whether the memory cells are defective. The memory layer may be a nanometer-scale memory device, such as a molecular memory, a carbon nanotube memory, an atomic memory, a single electron memory, or a memory fabricated by a chemical bottom-up method, etc.

23 Claims, 16 Drawing Sheets

SEMICONDUCTOR MEMORY DEVICE WITH MEMORY CELLS, EACH HAVING BIT REGISTERING LAYER IN ADDITION TO A MEMORY LAYER AND METHOD OF DRIVING THE SAME

CROSS-REFERENCE TO RELATED APPLICATION

This application claims the benefit of Korean Patent Application No. 10-2005-0086689, filed Sep. 16, 2005, the disclosure of which is hereby incorporated herein by reference in its entirety.

BACKGROUND OF THE INVENTION

1. Technical Field

The present invention relates to a semiconductor memory device, and more particularly, to a semiconductor memory device having a bit registering layer for recording information on whether memory cells storing data are in a good state or a bad state.

2. Discussion of Related Art

In a semiconductor memory device, if even one cell is found to be defective, the semiconductor memory device cannot perform its function normally and it is treated as defective. Even though the probability that defects occur is low, defective memory cells do occur and decrease yield. The defective cell may, however, be replaced with an auxiliary memory cell, which is prepared in advance inside a semiconductor memory device, so as to increase the yield. Because of this, a redundancy circuit is provided in order to repair the defective cell, which may be generated during the fabrication of semiconductor memory devices.

However, when the redundancy circuit is used, an area of a chip is increased and the number of tests necessary to repair defects is increased. Accordingly, the redundancy circuit has not been used much in a large scale integrated circuit (LSI). The redundancy circuit has been employed in a dynamic random access memory (DRAM) from 64K through 256K since the chip area increases compared to that of a LSI device.

More specifically, the redundancy circuit of the semiconductor memory device is a circuit used to fabricate defect-free semiconductor memory devices by: further forming additional cells (for example, $(n+m) \times (n+m') - n \times n$) in addition to the cells of a semiconductor memory device (for example, $n \times n$ cells) (here, m and m' mean the numbers of the redundancy cells); analyzing whether a defective memory cell exists or no; disconnecting a row or column including one or more defective cells; and connecting to the redundancy cells, to thereby provide $n \times n$ cells.

An efficiency of such a redundancy circuit will be explained in reference to attached drawings.

FIGS. 1 through 3 illustrate yields of an $n \times n$ memory block in accordance with a generation rate of defective bits for various redundancy cell sizes.

In FIG. 1, a Y-axis indicates a yield of memory blocks, and an X-axis indicates a generation rate of defective bits. The curves in FIG. 1 illustrate a relation of a generation rate of defective bits and a yield of $16 \times 16$ memory blocks in accordance with a redundancy cell size (m; m=1,2,4.) corresponding to the memory block.

As shown, the yield of memory blocks increases as the number of redundancy cells is increased at a constant generation rate of defective bits. For example, when a generation rate of defective bits is 0.01 (1%), and the number of redundancy cells m is 1, a yield of memory blocks is about 0.6 (60%). In a same generation rate of defective bits, when the redundancy cell size m is 2, a yield of memory blocks is about 0.95 (95%). That is, when a generation rate of defective bits is 0.01 and a redundancy cell size m is 4 or more, the yield of memory blocks is 1.

The description of the graphs of FIGS. 2 and 3 is similar to the description of FIG. 1.

As shown in FIG. 3, in order to fabricate a memory block of $n \times n = 1024 \times 1024$, even though a redundancy cell size is $2048 \times 2048$, that is, a semiconductor memory device is fabricated with a size of nine times the desired size of the memory device to be fabricated, a yield of a memory block is 0 at about a 0.3% generation rate of defective bits or higher.

That is, in a nanometer-scale memory device (for example, molecular memory, carbon nano-tube memory, atomic memory, single electron memory, and particularly, a memory fabricated by a chemical bottom-up method), in which a generation rate of defective bits will be difficult to decrease down to several percent or lower (for example, 1%), the method of repairing defective cells using redundancy cells as above may not be useful The nanometer-scale memory device is a memory device fabricated using a nano technology such as a submicron technology capable of controlling in units of nanometer (e.g., level to directly control molecules), that is, 0.000000001 meter. The nanometer-scale memory device may be called a nano device or a nano memory device. Examples of nanometer-scale memory devices are disclosed in U.S. Pat. NOS. 6,936,233 and 6,750,471.

A method of forming a separate memory layer and recording information on defective memory cells in the memory layer similar to a structure of a file allocation table (FAT) of a hard disk driver may be employed in order to overcome defects of the memory designing method of repairing defective cells using redundant cells. However, this method may also cause problems in the yield of memory blocks in accordance with a size of a block as illustrated in FIG. 4.

FIG. 4 is a graph illustrating an example of a yield of memory blocks when an $n \times n$ size of a semiconductor memory device is treated as a block unit. As illustrated in FIG. 4, as a size of a block is increased, a yield of memory blocks is rapidly decreased. For example, when a size of a memory block is $16 \times 16$ (n=16), and a generation rate of defective bits is 5E-3 (0.5%), a yield of memory blocks does not reach 0.4 (40%). This means that an area of the memory block is two times greater than if no defective bits occurred, and if the block size is further increased, this causes a problem that a required area is rapidly increased.

SUMMARY OF THE INVENTION

The present invention relates to a semiconductor memory device having a plurality of memory cells for storing data.

In one embodiment, the semiconductor memory device includes at least one bit registering layer for recording status information on the memory cells. For example, the bit registering layer may include a plurality of bit registers, each corresponding to one of the memory cells.

In one embodiment, each bit register is configured to record status information indicating whether the corresponding memory cell is defective. A bit register may be a one-time programmable memory. For example, the bit register may have a fuse or an anti-fuse structure.

In another embodiment, the semiconductor memory device includes first and second bit registering layers, and each of the first and second bit registering layers is configured to record status information on the memory cells.

In one embodiment, the memory layer is one of a molecular memory, a carbon nanotube memory, an atomic memory and a single electron memory.

The present invention also relates to a method of accessing a semiconductor memory device having a plurality of memory cells.

One embodiment of the method includes, reading status information recorded in a bit register associated with a memory cell, and accessing the memory cell based on the status information. The status information may indicate whether the memory cell is defective, and the accessing step does not access the memory cell if the status information indicates the memory cell is defective.

In one embodiment, the accessing step includes reading data from the memory cell based on the status information. In another embodiment, the accessing step includes writing data to the memory cell based on the status information.

Furthermore, in one embodiment, the reading step reads status information recorded in more than one bit register associated with the memory cell, and the accessing step accesses the memory cell if the status information read from each associated bit register indicates the memory cell is not defective.

In an alternative embodiment, the accessing step accesses the memory cell if the status information read from at least one of the associated bit registers indicates the memory cell is not defective.

In yet another embodiment, the accessing step does not access the memory cell if the status information read from at least one of the associated bit registers indicates the memory cell is defective.

An embodiment of the method also includes testing whether each of the memory cells is defective, and recording the status information in the bit registers based on the testing results.

BRIEF DESCRIPTION OF THE DRAWINGS

The above and other features and advantages of the present invention will become more apparent to those of ordinary skill in the art by describing in detail example embodiments thereof with reference to the attached drawings in which.

DETAILED DESCRIPTION OF EXAMPLE EMBODIMENTS

Figure 1:
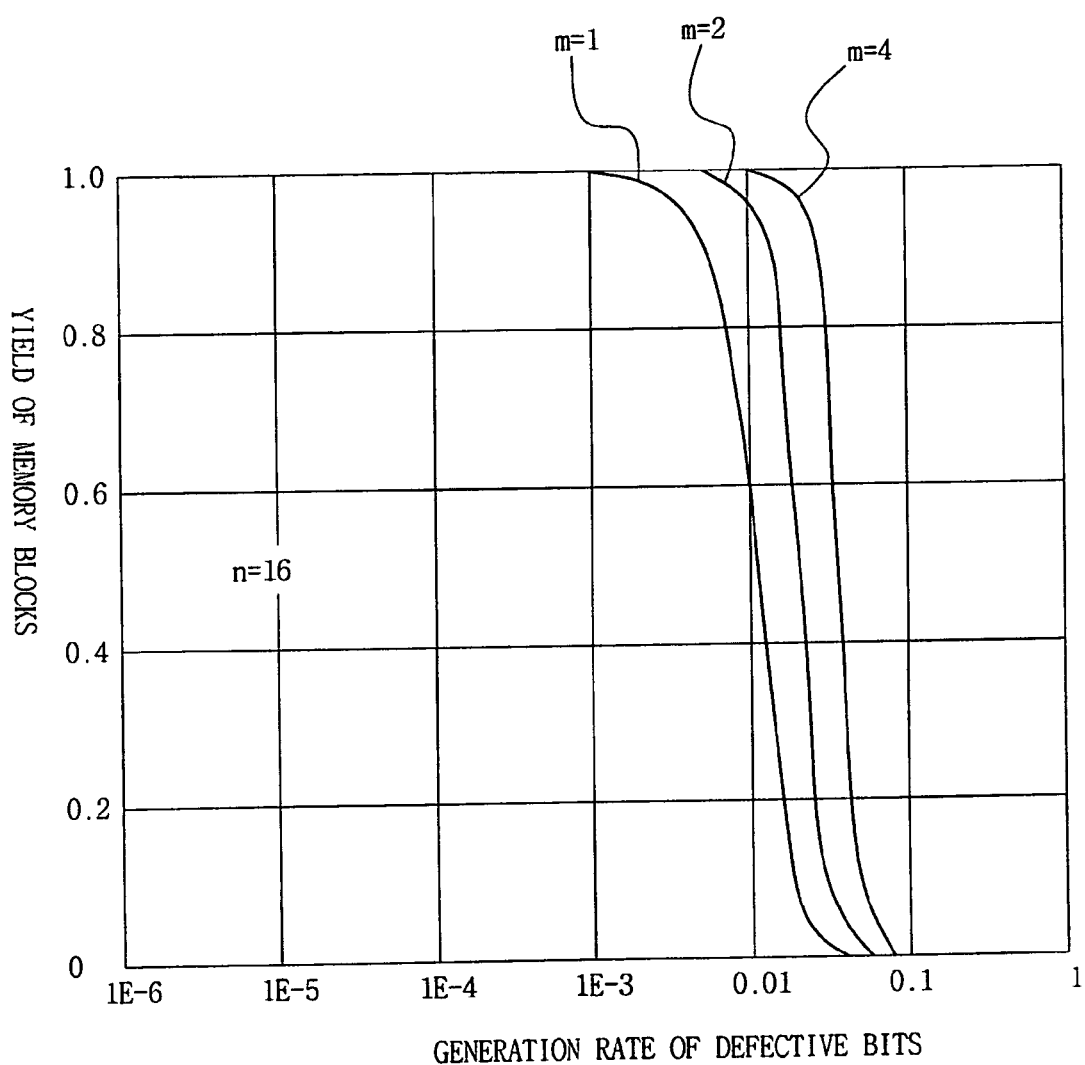
FIGS. 1 through 3 are graphs illustrating yields of memory blocks in accordance with a generation rate of defective bits for memory devices with various cell sizes and redundancy circuits.
Figure 2:
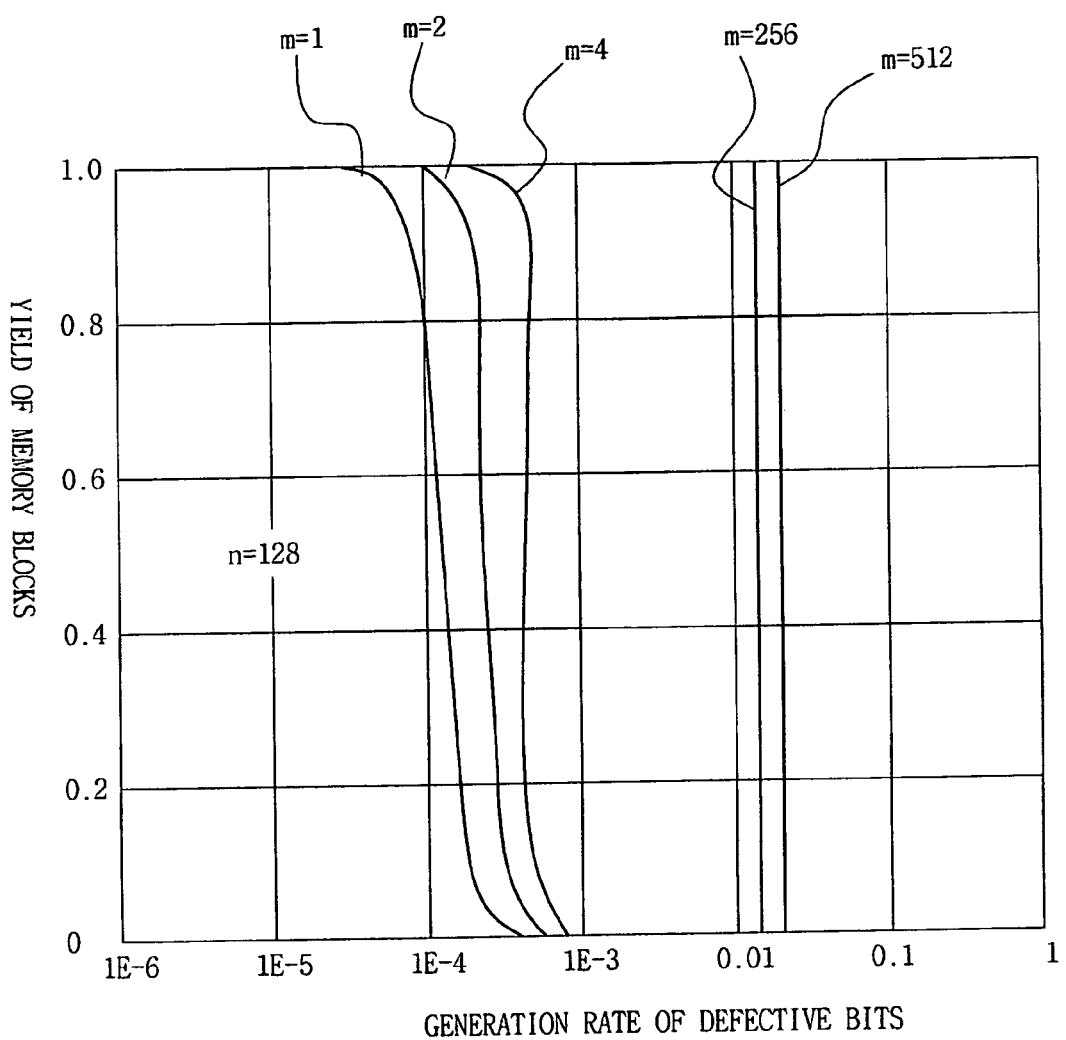
Figure 3:
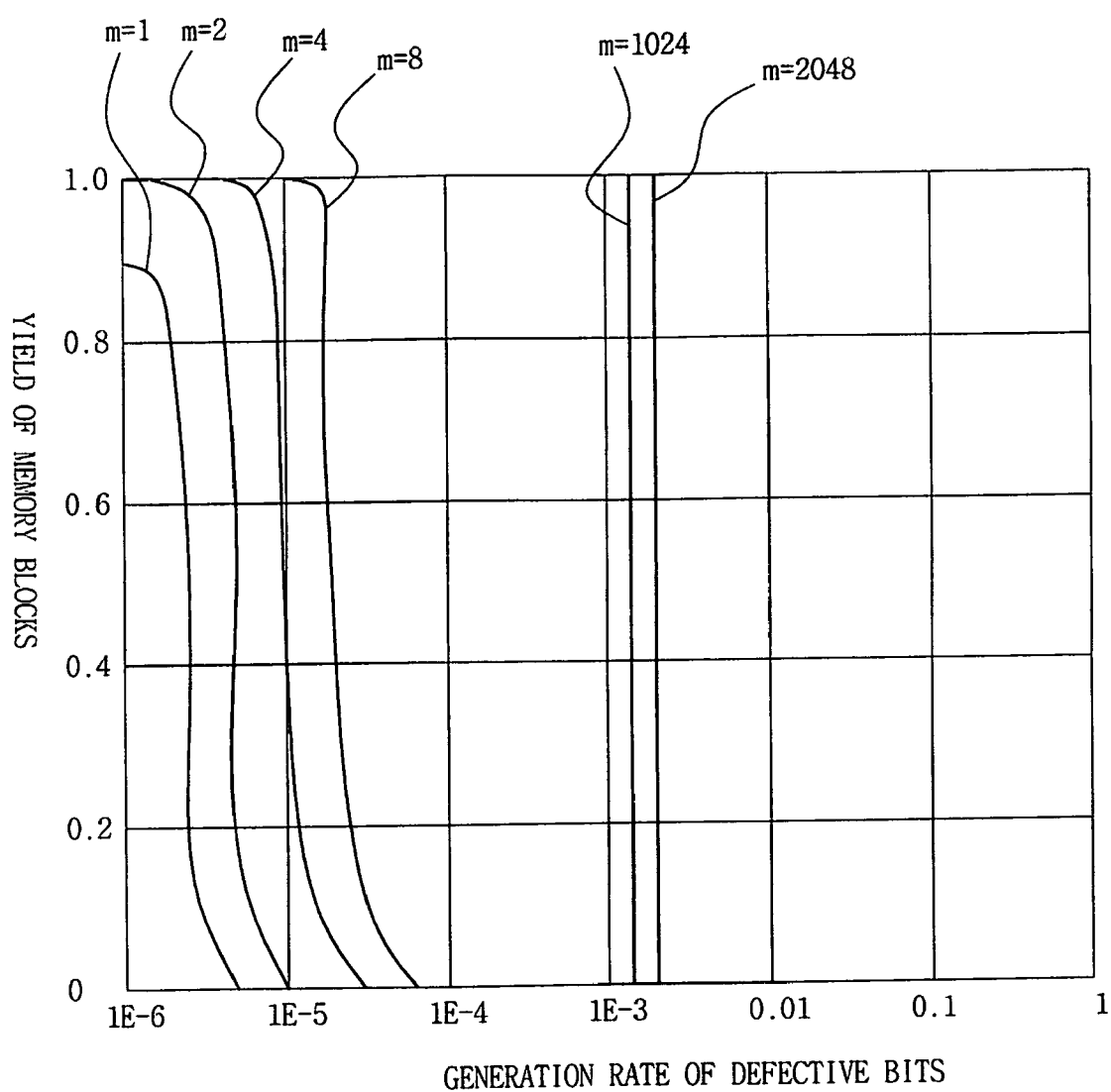
Figure 4:
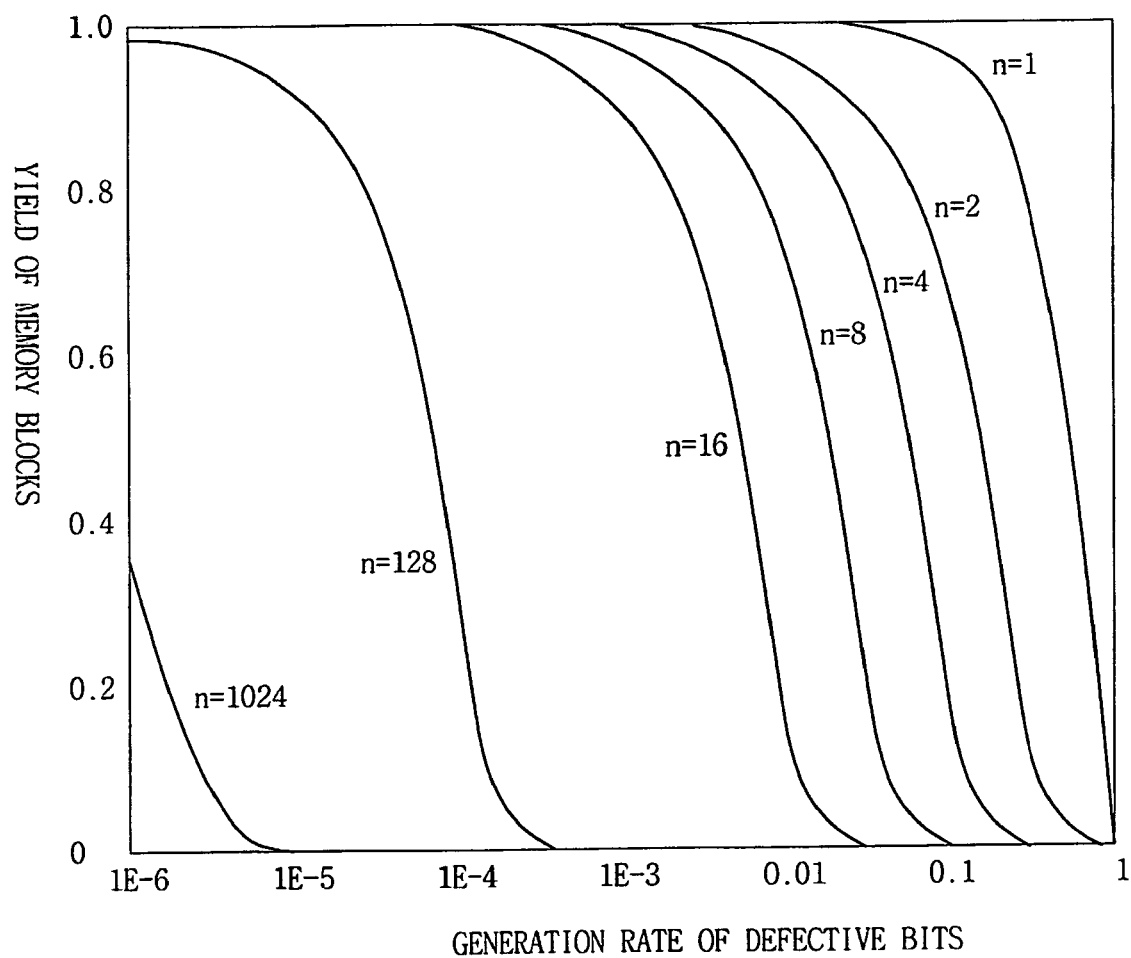
FIG. 4 is a graph illustrating an example of a yield of memory blocks when an n×n size of a semiconductor memory device is treated as a block unit.

The present invention will now be described with reference to the accompanying drawings, in which example embodiments of the invention are shown. However, the invention should not be construed as limited to only the embodiments set forth herein. Rather, these embodiments are presented as teaching examples. In the drawings, like numbers refer to like elements.

Figure 5A:
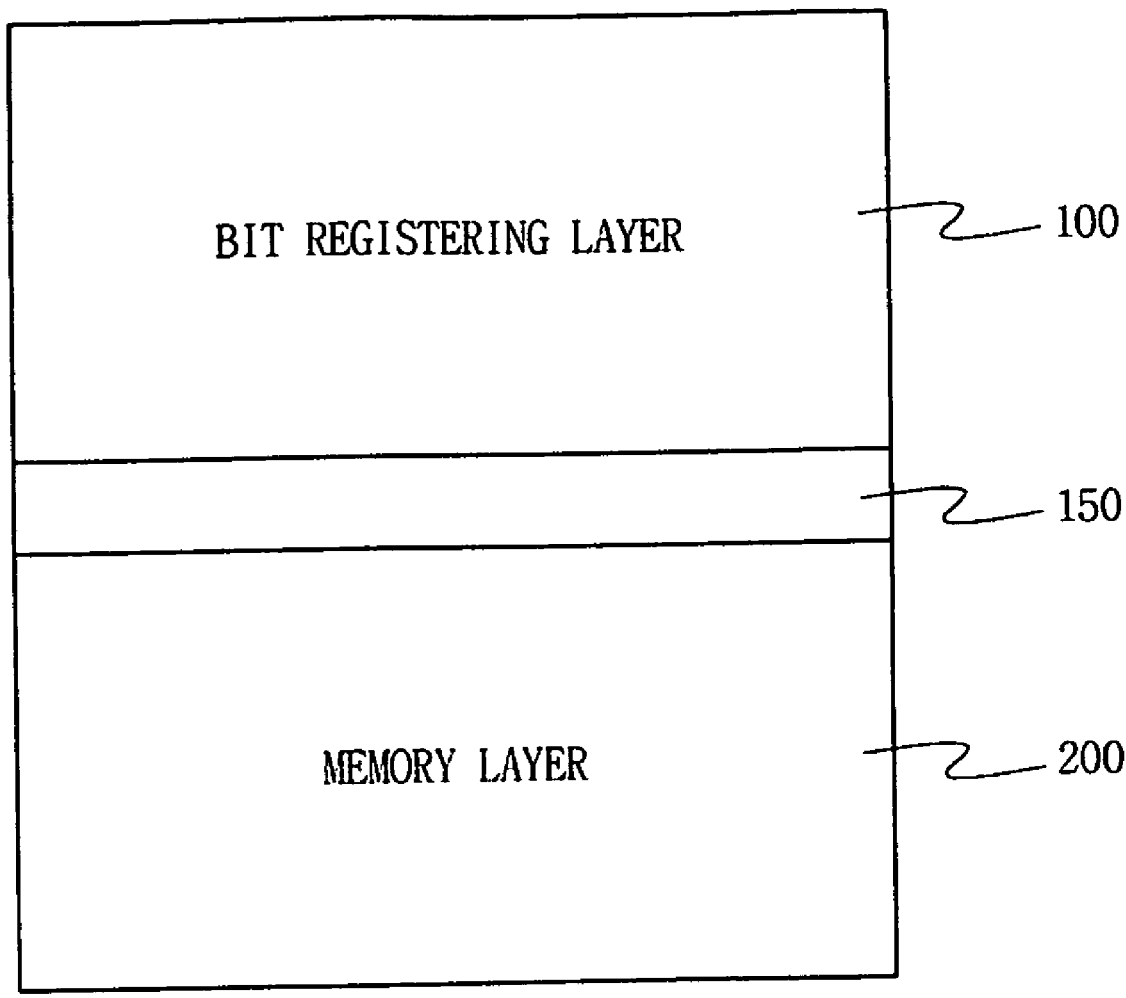
FIG. 5A is a schematic view partially illustrating a structure of a semiconductor memory device having a bit registering layer according to an embodiment of the present invention.
Figure 5B:
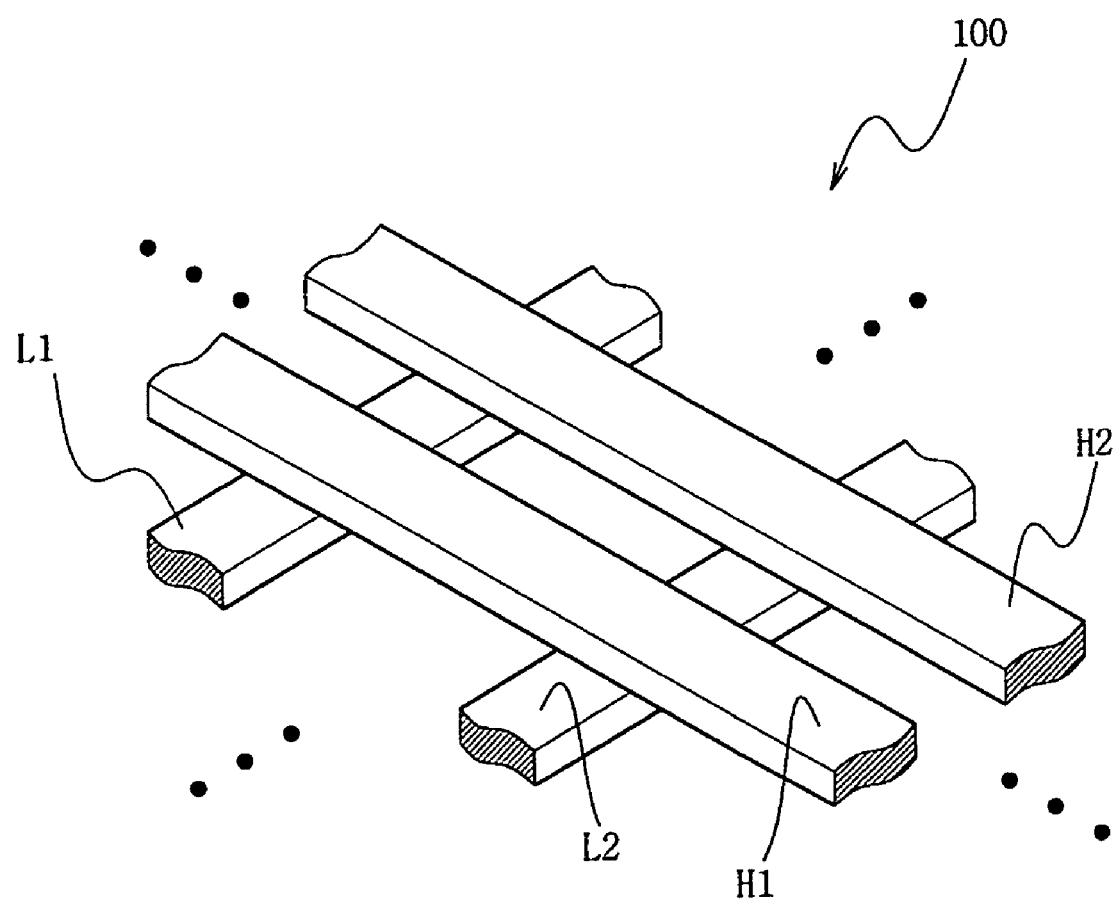
FIGS. 5B and 5C are schematic perspective views illustrating the bit registering layer of FIG. 5A.

FIG. 5A partially illustrates the structure of a semiconductor memory device having a bit registering layer according to an embodiment of the present invention, and FIG. 5B is a schematic perspective view illustrating the bit registering layer of FIG. 5A.

Referring to FIGS. 5A and 5B, the semiconductor memory device according to an embodiment of the present invention includes a memory layer 200 and a bit registering layer 100. An interlayer insulating layer 150 is disposed to insulate the bit registering layer 100 from the memory layer 200.

The memory layer 200 has memory cells for storing data.

The bit registering layer 100 functions to record status information on whether each of the memory cells is defective or not. In nanometer-scale memory devices, in which a generation rate of defective bits will be 10% or higher, the device may be meaningful when its block size is managed in the unit of 1 bit.

Thus, the bit registering layer 100 may have a plurality of bit registers respectively corresponding to the memory cells. In the plurality of bit registers respectively corresponding to the memory cells, information showing whether each of the memory cells is defective or not is recorded.

The bit registering layer 100 may be stacked on the memory layer 200 with the interlayer insulating layer 150 disposed between them as illustrated in FIG. 5A. Through this stacked structure, a total area of the semiconductor memory device having the bit registering layer 100 can be reduced.

For example, data 0 is recorded in the bit register corresponding to a bad, defective memory cell, and if a memory cell is in a good, non-defective state, data 1 may be recorded in the bit register corresponding to the memory cell. Thus, if the memory cell is in a bad state, data 0, to prevent an access to the memory cell, is recorded in the bit register so that the defective memory cell is not accessed during an operation of the semiconductor memory device.

Alternatively, data 1 is recorded in the bit register corresponding to a defective memory cell, and if a memory cell is in a good state, data 0 may be recorded in the bit register corresponding to the memory cell.

The bit register may be a one-time programmable memory. This is because a defective bit, rarely changes to a good bit, and when the bit tested in the memory layer is a defective bit, one-time programming may be performed in a bit register corresponding to the defective bit. Thus, the bit register may be a read only memory (ROM).

Even though the bit register is not illustrated specifically in FIG. 5B, it may be formed at cross points of upper metal layers H1 and H2, and lower metal layers L1 and L2.

For example, the bit register may be formed with a fuse structure. That is, when the memory cell is in a good state, the bit register may be structured to maintain its initial connection state (data 1 is recorded in the bit register in this case), and when the memory cell is in a bad or defective state, the bit register may be structured to be insulated (data 0 is recorded in the bit register in this case). The bit register may be insulated using various methods, such as by flowing an over-current through the bit register, or may be insulated by applying a laser beam. This will be explained in more detail with reference to FIG. 8.

Alternatively, the bit register may be formed with an anti-fuse structure. That is, when a memory cell is in a good or non-defective state, it maintains an insulating state as an initial state (data 0 is recorded in the bit register in this case.). When the memory cell is in a defective state, the bit register may be structured to be connected (data 1 is recorded in the bit register in this case.).

Furthermore, since the bit register may also be in a good state or a bad state, when the bit register is in a bad state regardless of whether the memory cell corresponding to the bit register is in a good state or in a bad state, the bit register may have the same data value as that of the bit register when the memory cell is in a bad or defective state. Thus, malfunction during operation may be reduced since the bit register is recorded with information that the memory cell is in a good state even when the memory cell is in a bad state and the bit register corresponding thereto is in a bad state. This will be explained in more detail in reference to FIG. 7.

Figure 5C:
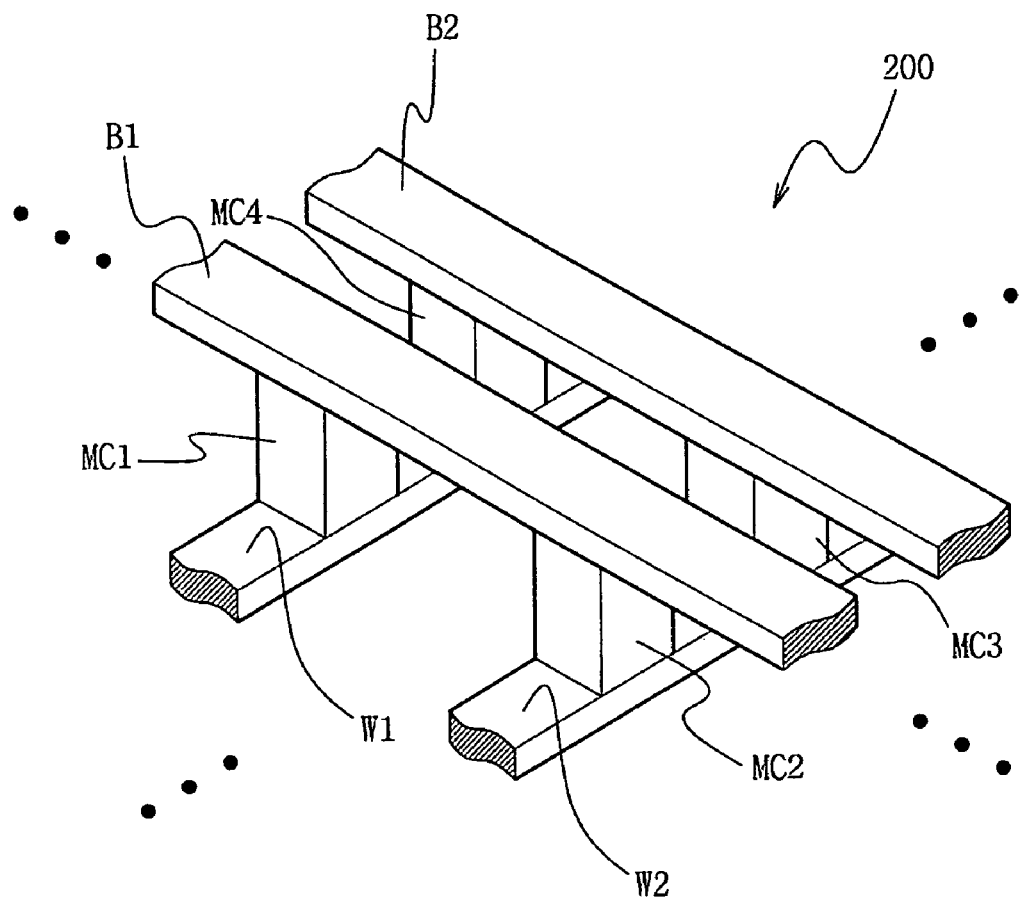

FIG. 5C is a schematic perspective view illustrating a memory layer 200 in FIG. 5A. The memory layer 200 includes bit line B1 and B2; memory cells MC1, MC2, MC3, MC4; and word lines W1 and W2.

Figure 6:
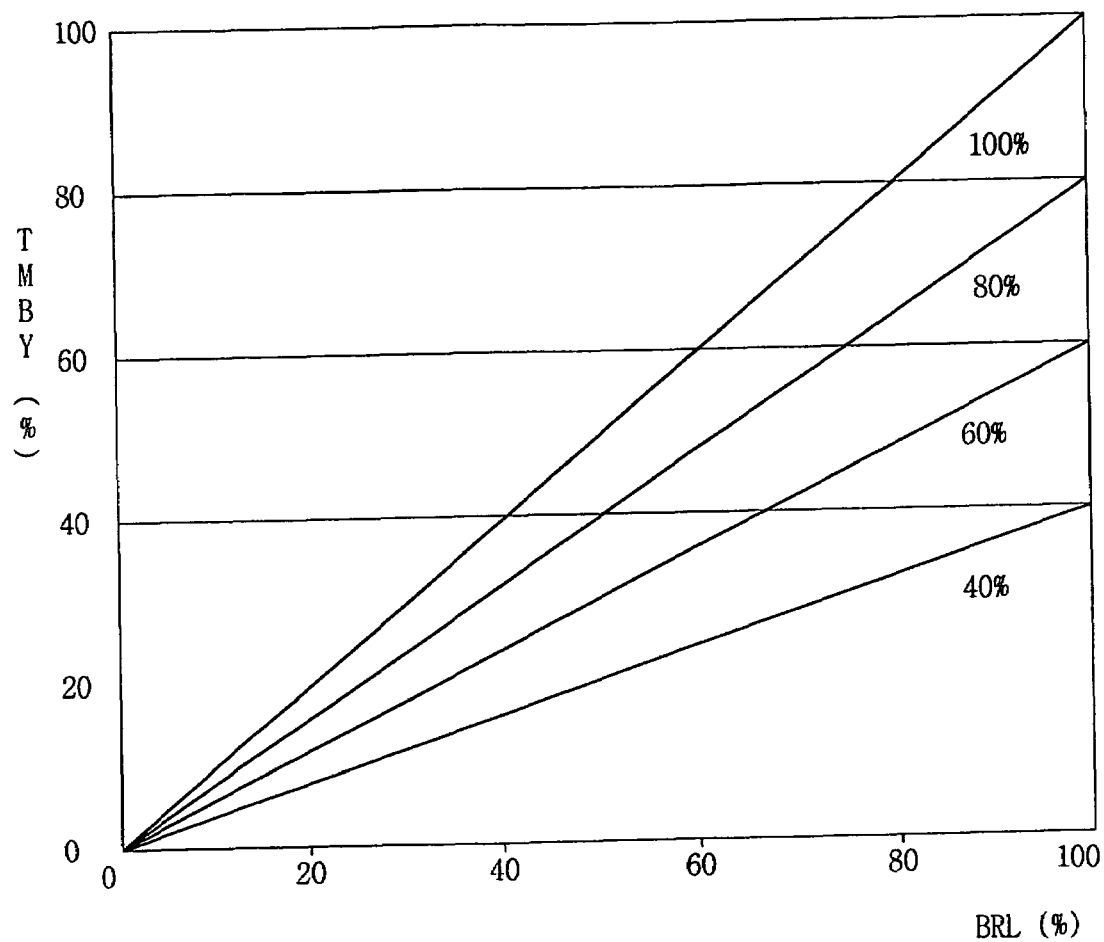
FIG. 6 is a graph illustrating a yield of total memory bits in accordance with an effective bit in the bit registering layer of the semiconductor memory device of FIG. 5A.

FIG. 6 is a graph illustrating an effective bit in the bit registering layer of the semiconductor memory device of FIG. 5A, that is, a yield of total memory cells in accordance with a good state of a bit register in the bit registering layer (or, a yield of memory bits).

In FIG. 6, the X-axis (bit register layer: BRL) indicates a yield of bit registering layers, that is, a percentage (%) showing a good state of a bit register, and the Y-axis (total memory bit yield: TMBY) indicates a percentage (%) of a yield of total memory cells.

Referring to FIG. 6, a yield of total memory cells in accordance with a yield of bit registering layers is illustrated for a bit yield in a memory layer of 40%, 60%, 80%, and 100%.

For example, when a yield of bits in the memory layer is 40%, the yield of total memory cells is 40% (in this case, a yield of bit registering layers is 100%). But, if a yield of bit registering layers is 80%, a yield of total memory cells is about 30%.

When a yield of bits in the memory layer is 100%, that is, there exist no defective bits, a yield of total memory cells may be determined depending on a yield of the bit registering layers. That is, if a yield of bits in the memory layer is 100%, and a yield of bit registering layers is 20%, a yield of total memory cells is 20%. If a yield of bit registering layers is 60%, a yield of total memory cells is 60%.

Figure 7:
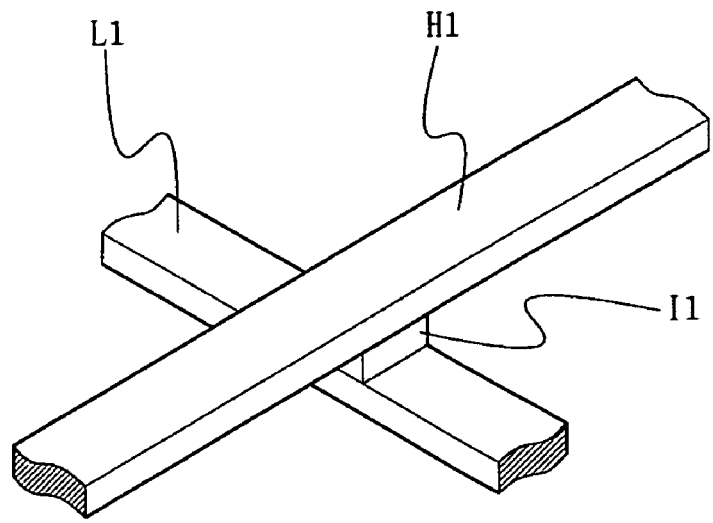
FIGS. 7 and 8 are schematic perspective views illustrating an example of a bit register in the bit registering layer of FIG. 5B.
Figure 8:
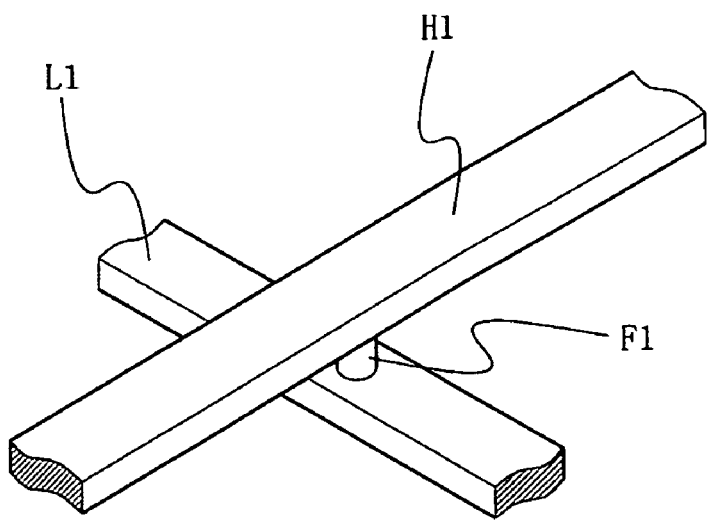

FIGS. 7 and 8 are schematic perspective views illustrating an example of a bit register in the bit registering layer of FIG. 5B.

Referring to FIG. 7, a bit register of an anti-fuse structure is illustrated, in which an upper metal layer H1 and a lower metal layer L1 are insulated by an insulating layer I1.

When a memory cell corresponding to the bit register is in a good or non-defective state, an insulating state is maintained by the insulating layer I1, and when a memory cell corresponding to the bit register is in a bad or defective state, an over-current is flowed through the upper metal layer H1 to break the insulating layer I1 so that the upper metal layer H1 and the lower metal layer L1 are electrically connected.

Alternatively, when a memory cell corresponding to the bit register is in a good state, an over-current may be flowed to the upper metal layer H1 to break the insulating layer I1 so that the upper metal layer H1 and the lower metal layer L1 are electrically connected, and when a memory cell corresponding to the bit register is in a bad state, an insulating state may be maintained by the insulating layer I1.

The bit register may be in a non-defective state or in a defective state. For example, since the insulating layer I1 may be damaged during the formation of the bit register, the bit register may always be connected regardless of the state of the corresponding memory cell. Because of this, even when the memory cell is in a bad state, a corresponding bit register may be in an undesirable state. Therefore, in order to reduce such a malfunction, in the case that the bit register, itself is in a defective state, it may have the same value as that of the data to be recorded in the bit register when a corresponding memory cell is in a defective state. Thus, when a corresponding memory cell is in a good state, an insulating state may be maintained in a bit register, and when a corresponding memory cell is in a bad state, a connection state may be maintained.

FIG. 8 illustrates a fuse structure of a bit resister, in which an upper metal layer H1 and a lower metal layer L1 are connected by a fuse F1.

When a memory cell corresponding to the bit register is in a good or non-defective state, the connection state provided by the fuse F1 is maintained, and when a memory cell corresponding to the bit register is in a bad or defective state, an over-current is flowed through the upper metal layer H1 to disconnect the fuse F1 so that the upper metal layer H1 and the lower metal layer L1 are electrically insulated.

Alternatively, when a memory cell corresponding to the bit register is in a non-defective state, an over-current may be flowed to the upper metal layer H1 to cut the fuse F1 so that the upper metal layer H1 and the lower metal layer L1 are electrically insulated, and when a memory cell corresponding to the bit register is in a defective state, a connection state provided by the fuse F1 may be maintained.

Similarly, when the memory cell is in a bad state, a corresponding bit register may be in an undesirable state (for example, a fuse F1 of the bit register is already cut before setting). Therefore, in order to reduce such a malfunction, the bit register may be maintained in the connection state when the corresponding memory cell is in a good state, and when the corresponding memory cell is in a bad state, the bit register may be structured to maintain its insulating state.

As such, after testing whether each of the memory cells is in a good state or a bad state, and programming a bit register corresponding to each of the memory cells based on the test result, the bit register is first accessed during a power-up of a semiconductor memory device so as to determine whether a corresponding memory cell is accessible or not (e.g., defective or not).

Therefore, according to embodiments of the present invention, defects in a large amount of defective bits can be effectively dealt with. Particularly, embodiments of the present invention may be employed in a nanometer-scale memory device such as a molecular memory having a high generation rate of defective bits, and the like.

The bit registering layer may be formed by a method different from that of forming the memory layer, or may be formed by the same method as that of forming the memory layer. That is, when the memory layer is formed by the method of fabricating a molecular memory device, the bit registering layer may be formed by a method different from the method of fabricating a molecular memory device, or may be formed by the same method as that of fabricating a molecular memory device like the memory layer.

Figure 9A:
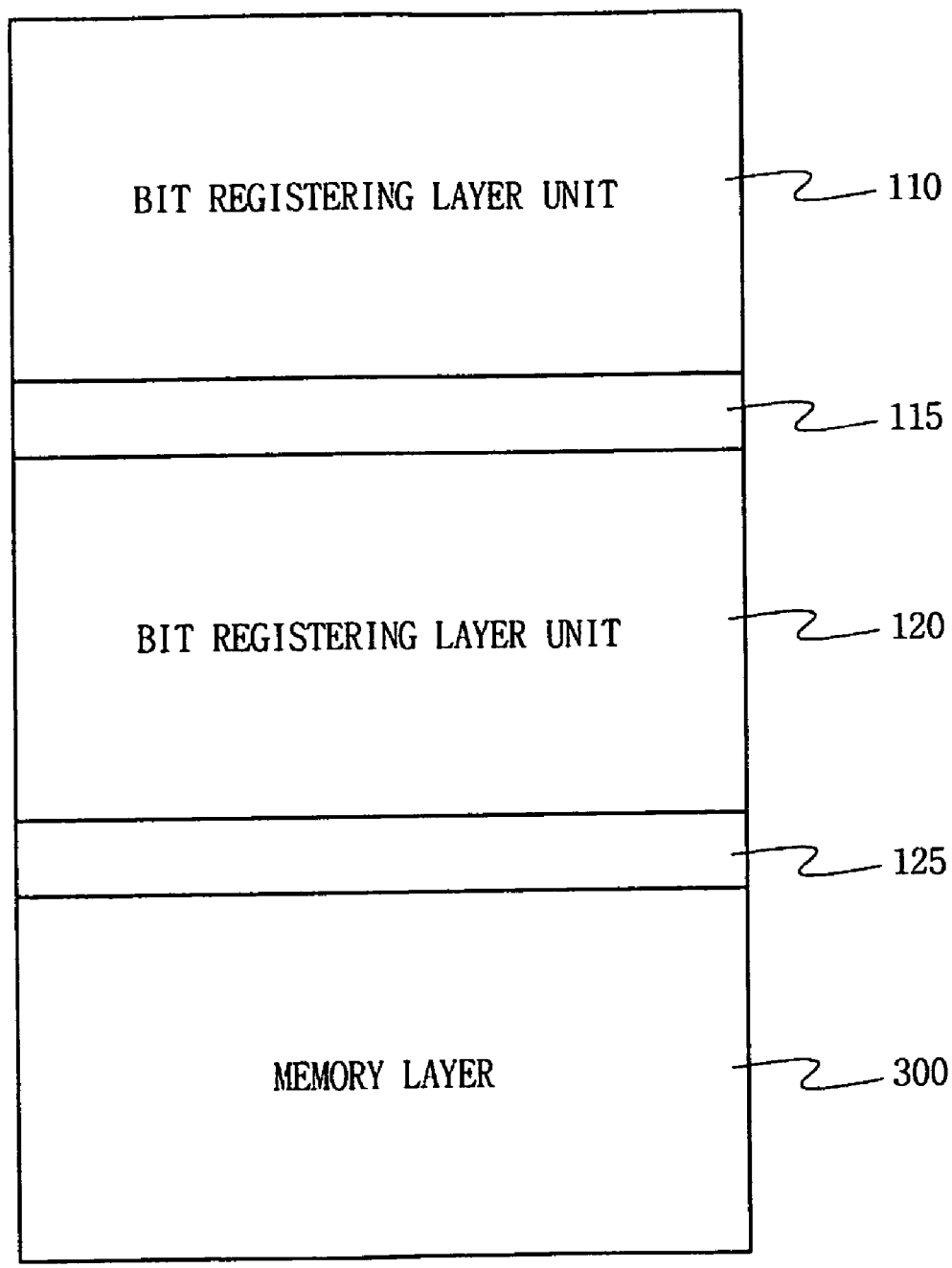
FIG. 9A is a schematic view partially illustrating a structure of a semiconductor memory device having bit registering layers according to another embodiment of the present invention.
Figure 9B:
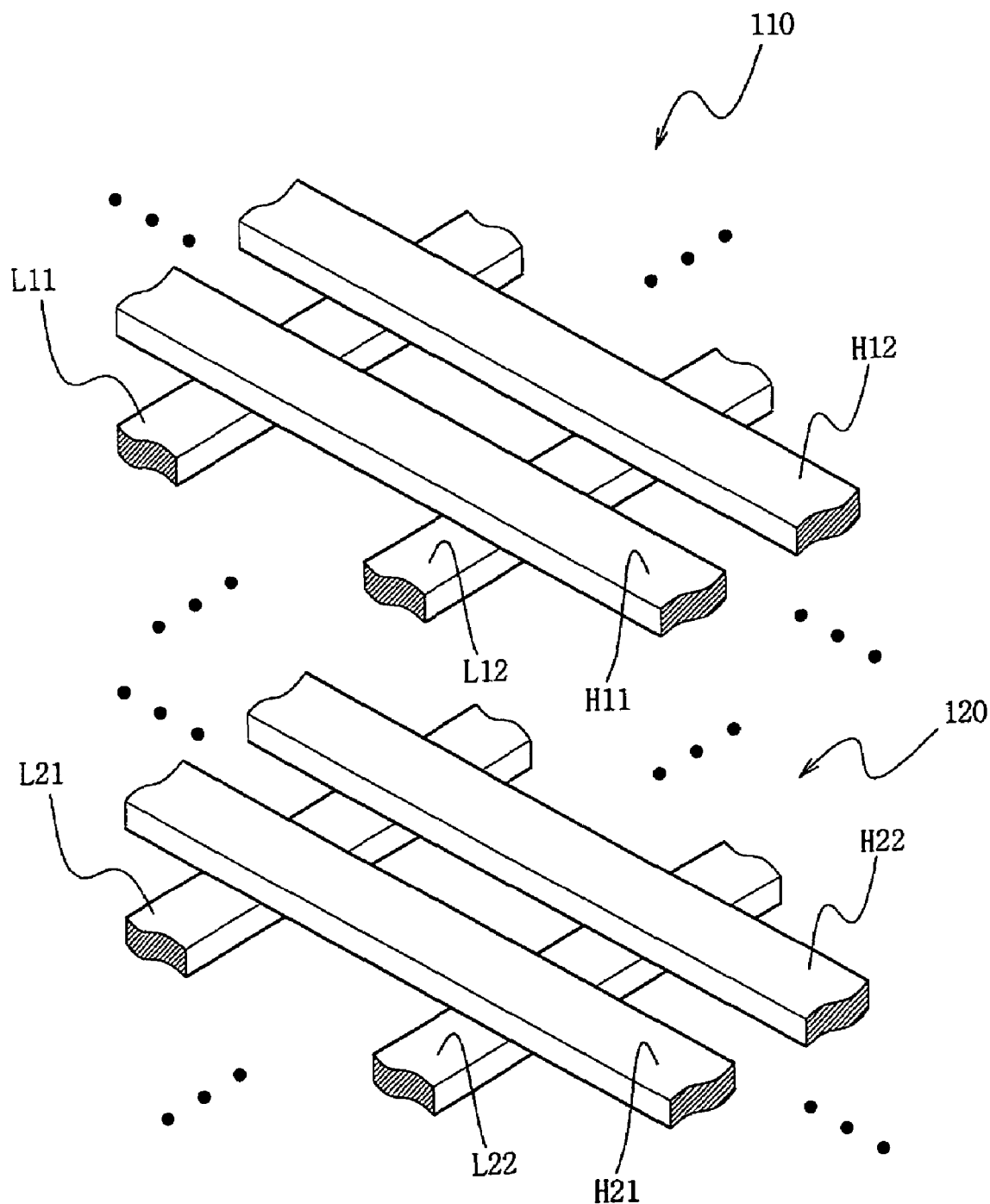
FIGS. 9B and 9C are schematic perspective views illustrating the bit registering layer unit of FIG. 9A.

FIG. 9A is a schematic view partially illustrating a structure of a semiconductor memory device having bit registering layers according to another embodiment of the present invention, and FIG. 9B is a schematic perspective view illustrating the bit registering layers of FIG. 9A. In particular, this embodiment includes two bit registering layers.

In the semiconductor memory device illustrated in FIGS. 5A and 5B, a ratio of the number of bit registers of the bit registering layer and the number of memory cells of the memory layer is equal to 1:1, and in the semiconductor memory device illustrated in FIG. 9A, a ratio of the number of bit registers of the bit registering layers and the number of memory cells of the memory layer is equal to 2:1.

Referring to FIGS. 9A and 9B, the semiconductor memory device includes a memory layer 300 having memory cells for storing data. Two bit registering layers 110 and 120, each having a plurality of bit registers respectively corresponding to the memory cells and being different from each other in accordance with a defective state or a non-defective state of a corresponding memory cell, are formed over the memory layer 300. The bit registering layers 110 and 120 and the memory layer 300 are respectively insulated by interlayer insulating layers 115 and 125.

FIG. 9B shows that the first bit registering layer 110 includes upper metal layers H11 and H12 and lower metal layers L11 and L12 having the same structure as the as the bit registering layer 100 in FIG. 5B. Similarly, FIG. 9B Shows that the second bit registering layer 120 includes upper metal layers H21 and H22 and lower metal layers L21 and L22 having the same structure as the bit registering layer 100 in FIG. 5B. Namely, it will be understood that the first and second bit registering layers 110 and 120 may have the specific structure described in detail with respect to FIG. 7 or FIG. 8, and the first and second bit registering layers 110 and 120 may have different specific structures.

Also, in view of the above, the non-defective and defective states conveyed by the first and second bit registering layers 110 and 120 may be as described with respect to bit registering layer 100 above with respect to FIGS. 5A-8, including all associated alternatives.

Since a bit register corresponding to one memory cell in the memory layer 300 is disposed in each of the two bit registering layers 110 and 120, two bit registers correspond to one memory cell. Thus, when one of the bit registers corresponding to a same memory cell is in a bad or defective state, and the remaining one is in a good or non-defective state, and their corresponding memory cell is in a good state, the memory cell is accessed during an operation of the semiconductor memory device.

For example, when one of the bit registers corresponding to the memory cell in the memory layer 300 is in a bad state, and a remaining one of the bit registers corresponding to the memory cell is in a good state, information showing a good state or a bad state of the memory cell may be based on the bit register in the good state. However, it will be appreciated that other options may be employed. For example, if one of the bit registers indicates the memory cell is defective, the memory cell is treated as defective. Namely, both bit registers have to indicate that the associated memory cell is good, for the memory cell to be treated as good (e.g., treated as accessible). As another example, the memory cell is treated as defective only if both associated bit registers indicate the memory cell is defective.

Figure 9C:
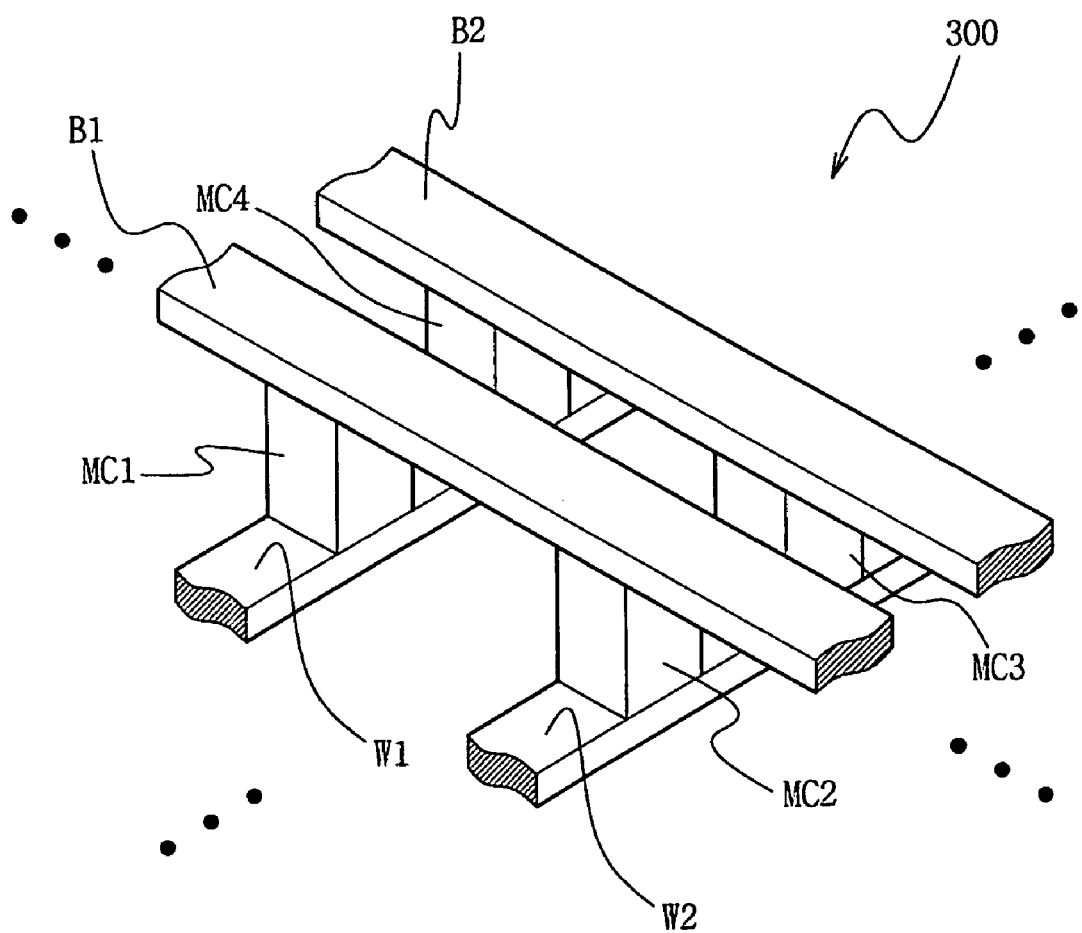

FIG. 9C is another schematic perspective view illustrating a memory layer 300 in FIG. 9A. The memory layer 300 includes bit line B1 and B2; memory cells MC1, MC2, MC3, MC4; and word lines W1 and W2.

Figure 10:
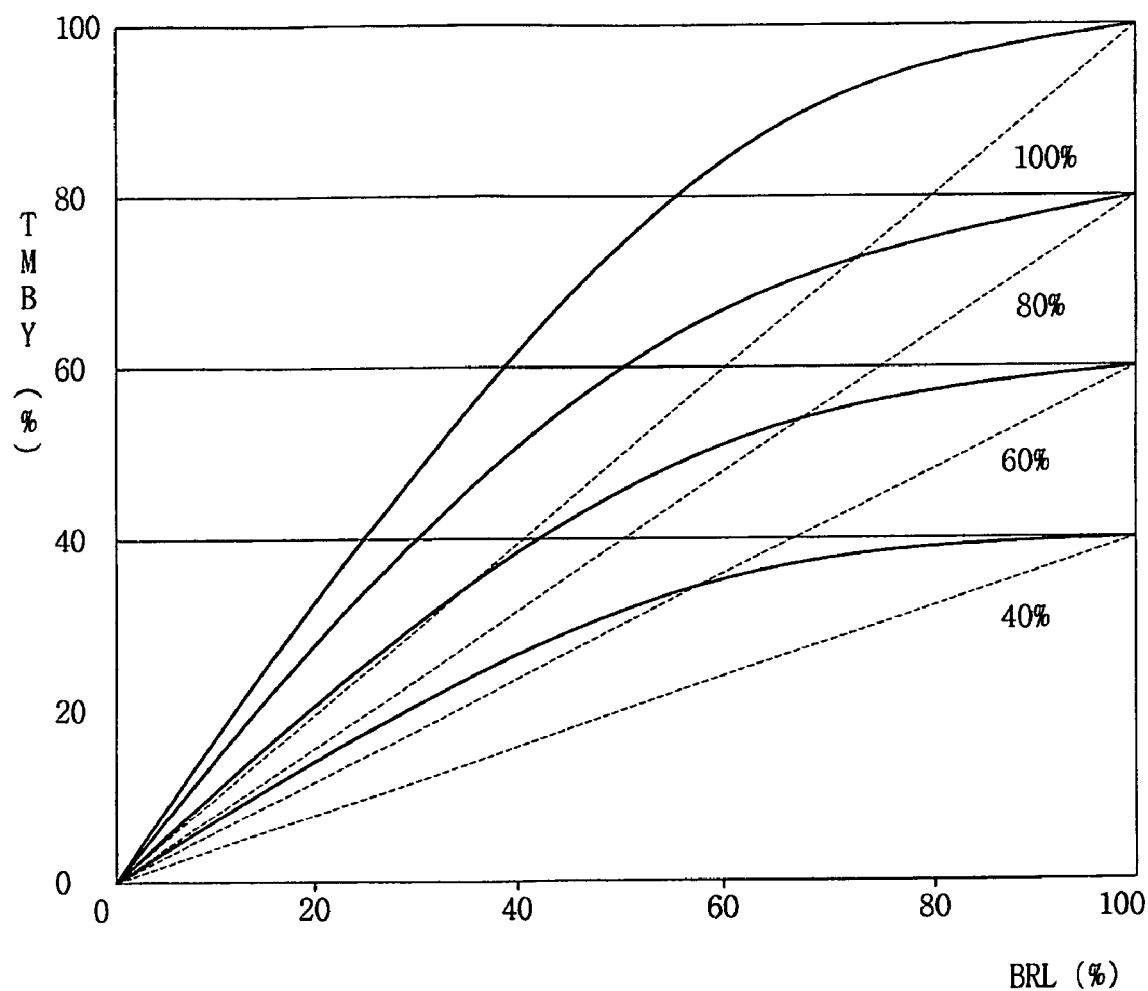
FIG. 10 is a graph illustrating a yield of total memory bits in accordance with an effective bit in the bit registering layers of the semiconductor memory device of FIG. 9A.

FIG. 10 is a graph illustrating a yield of total memory bits in accordance with an effective bit in the bit registering layer of the semiconductor memory device of FIG. 9A.

Referring to FIG. 10, a yield of total memory cells in accordance with a yield of two bit registering layers is illustrated for a bit yield of 40%, 60%, 80%, and 100%. A graph indicated by a dotted line illustrates the case of one bit registering layer, that is, the semiconductor memory device illustrated in FIG. 5A.

For example, when a bit yield of the memory layer is 40%, a yield of total memory cells is ideally 40% (in this case, a yield of a bit registering layer is 100%). But when a yield of the bit registering layers is 80%, a yield of total memory cells is close to 40%. It is acknowledged that the yield of two bit registering layers is significantly improved as compared with the yield of one bit registering layer.

In the above description, two bit registering layers are exemplarily explained, but the embodiment may be applicable to the cases of three or more bit registering layers. In this case, a yield of total memory cells may be much closer to an ideal value. Furthermore, a threshold number of bit registers indicating a good or bad state may be used to decide whether an associated memory cell is in a good or bad state.

Figure 11:
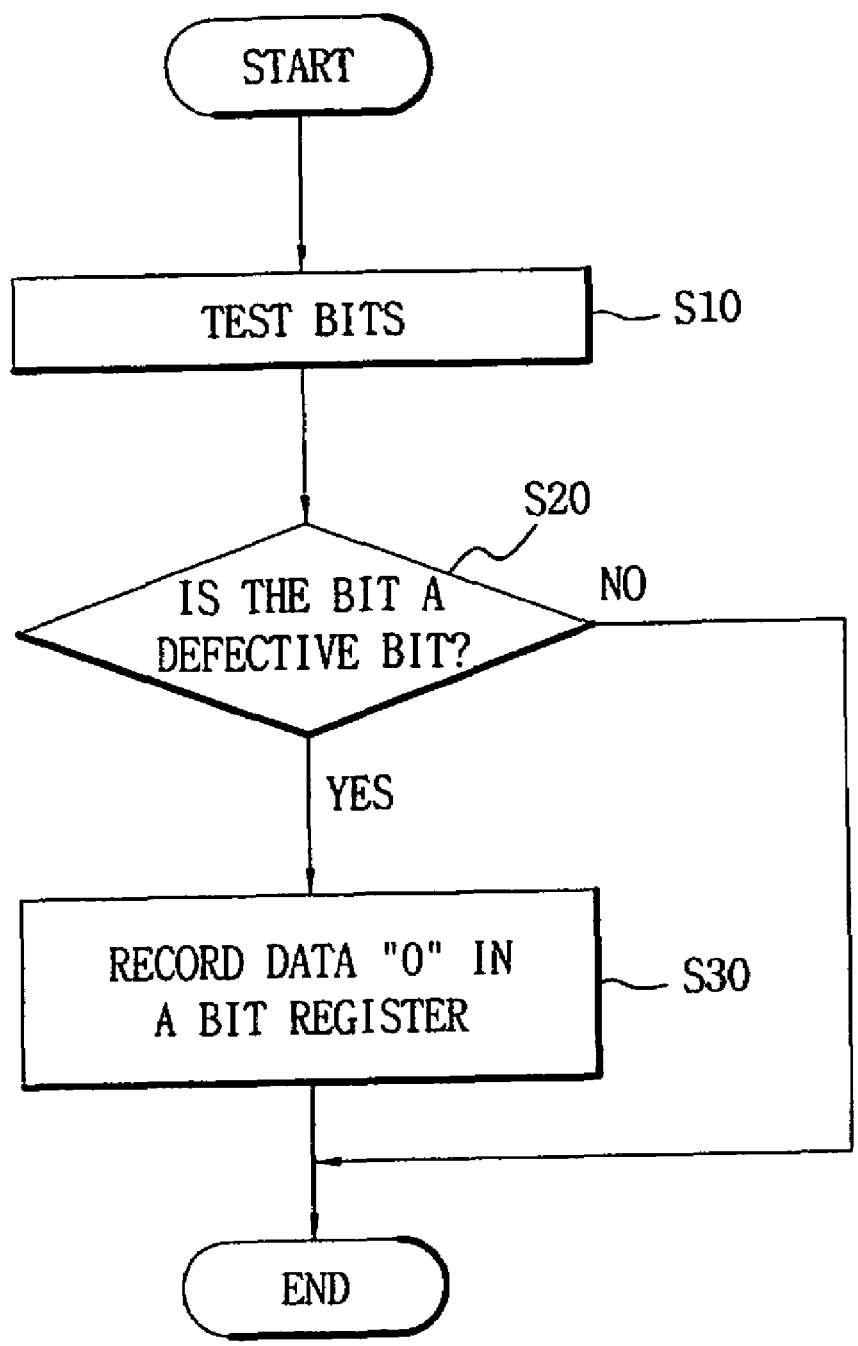
FIGS. 11 through 13 are flow charts illustrating a method of driving a semiconductor memory device according to an embodiment of the present invention.

Referring to FIG. 11, a process of setting the bit register based on the test results of each memory cell will be explained.

First, whether each of memory cells is in a good state or a bad state is tested in the unit of a bit (S10), and whether the tested memory cell is a defective bit, that is, a memory cell in a bad state, or a memory cell in a good state is determined (S20). As will be appreciated, both the testing and defective bit determination processes are well-known in the art; and therefore, will not be described in detail for the sake of brevity. If the memory cell is defective, data 0 is recorded to its corresponding bit register. If the tested memory cell is in a good state, an initial state of the bit register corresponding to the memory cell is maintained. In this case, the initial state of the bit register corresponding to the memory cell is a state showing the data distinguished from data 0 (for example, data 1). Alternatively, if the tested memory cell is in a good state, data 1, which is distinguished from the case of a bad state, may be recorded to a corresponding bit register.

As a further alternative, if the tested memory cell is in a bad state, data 1 may be recorded to the corresponding bit registers. In this case, an initial state of the bit register corresponding to the memory cell is a state showing data distinguished from data 1 (for example, data 0). Alternatively, if the tested memory cell is in a good state, data 0, which is distinguished from data showing a bad state, may be recorded to the associated bit registers. Other variations of the process will be readily apparent from this disclosure.

The process of setting the bit register may be performed for each memory cell by repeating the above operation. Thus, information on the test results is recorded to the bit registers respectively corresponding to each memory cell. As described above, when two or more bit registering layers are disposed, the bit registers corresponding to each of the memory cells may be two or more.

Further, when a corresponding bit register is in a bad state regardless of the test result, the method may further include a step of making the memory cell corresponding to the bit register have the same state as that of the bit register in the bad state. Thus, when the bit register itself is in a bad state, the corresponding memory cell is set to a bad state such that the memory cell may not be accessed.

Figure 12:
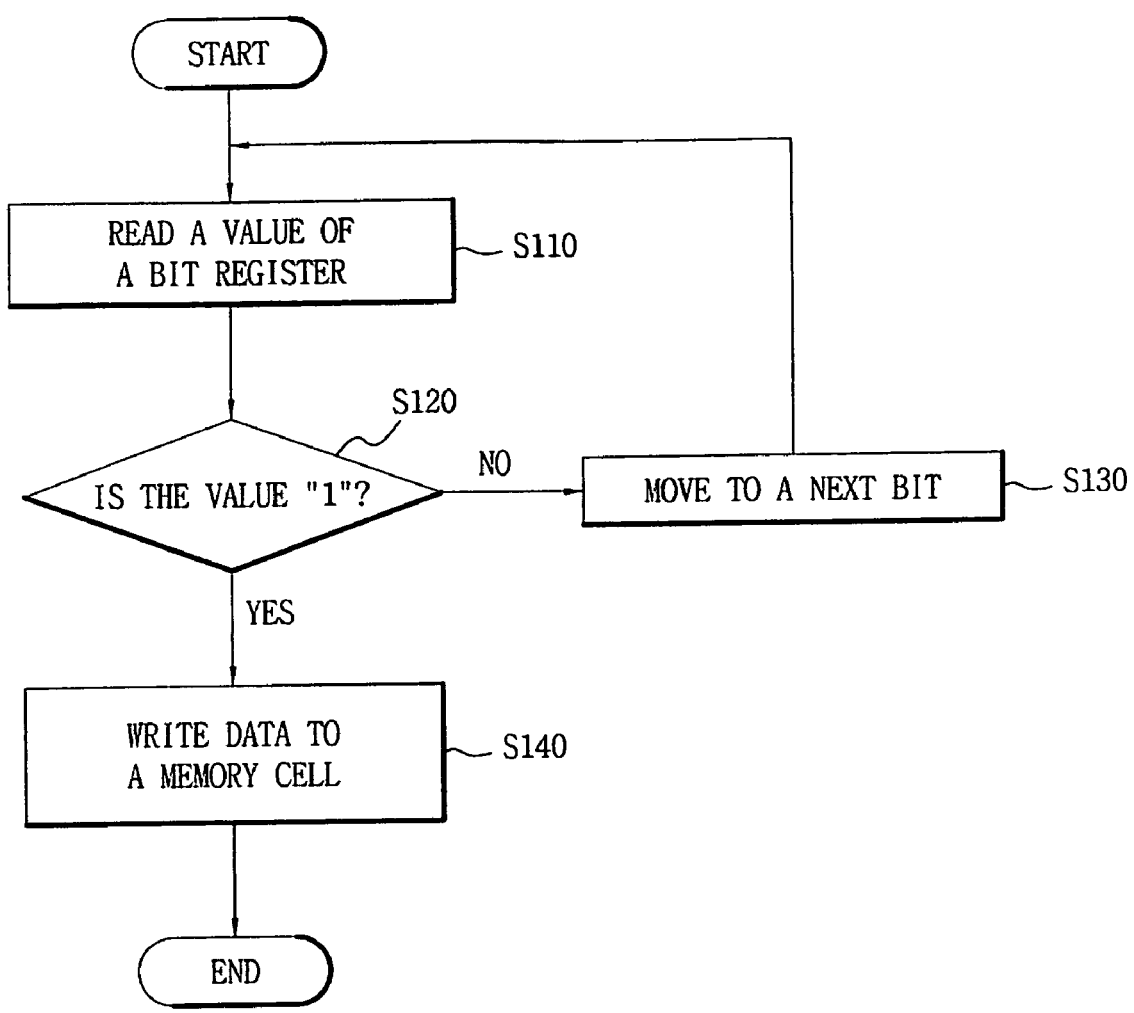

Referring to FIG. 12, a process of writing data to a memory cell of the semiconductor memory device after the process of setting the bit register described with respect to FIG. 11 will be explained.

First, data recorded to a corresponding bit register is read (S110), and whether the recorded data is 1 or 0 is determined (S120). When the recorded data is 0, data is not written to the memory cell, and the process moves to a next bit register (S130). When the recorded data is 1, data is written to the memory cell (S140). The process is repeated for the number of data bits input to the semiconductor memory device, thereby completing writing of the input data to the memory cells. Of course it will be understood that a defective state could be indicated by a 1 instead of a 0. In this case, data is not written if the bit register has a 1 recorded therein, and data is written if the bit register has a 0 recorded therein.

Figure 13:
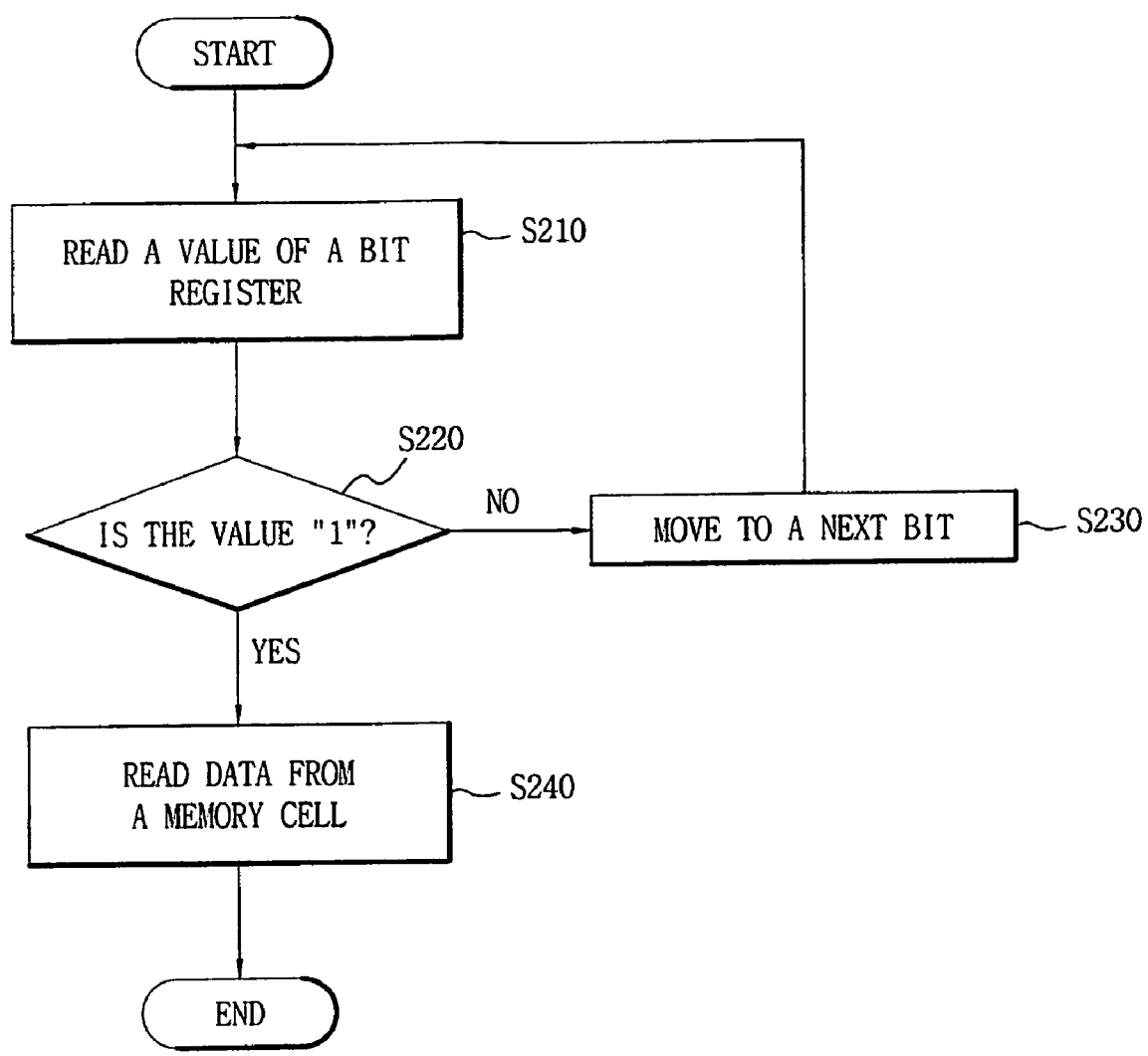

Referring to FIG. 13, a process of reading data from the memory cell of the semiconductor memory device after the process of setting the bit register described above with respect to FIG. 11 will be explained.

First, data recorded in a corresponding bit register is read (S210), and whether the recorded data is 1 or 0 is determined (S220). When the recorded data is 0, data is not read from the memory cell, and the process moves to a next bit register (S230). When the recorded data is 1, data is read from the memory cell (S240). The process is repeated for the number of data bits to be read from the semiconductor memory device, thereby completing reading data from the memory cells. Of course it will be understood that a defective state could be indicated by a 1 instead of a 0. In this case, data is not read if the bit register has a 1 recorded therein, and data is read if the bit register has a 0 recorded therein.

As described above, the bit registering layer of the present invention may be employed in a semiconductor memory device having a high generation rate of defective bits, for example, a molecular memory, a carbon nanotube memory, an atomic memory, a single electron memory; particularly, a nanometer-scale memory device, such as a memory fabricated by a chemical bottom-up method, and the like so that a yield of such a memory can be further improved. Further, the present invention provides an effect of increasing a yield of such semiconductor memory devices.

The invention has been described using example embodiments. However, it is to be understood that the scope of the invention is not limited to the disclosed embodiments. The semiconductor memory device having a bit registering layer and a method of driving the same according to embodiments of the present invention are not limited to the embodiments, but may be modified and applied in various forms and alternative arrangements within the scope of the present invention. The scope of the claims, therefore, should be accorded the broadest interpretation so as to encompass all such modifications and similar arrangements.

What is claimed is:

1. A semiconductor memory device having a plurality of memory cells for storing data, the semiconductor memory device comprising:
   at least two bit registering layers including first and second bit registering layers, each of the first and second bit registering layers configured to record status information on the memory cells and the at least two bit registering layers further including a plurality of bit registers, each bit register corresponding to one of the memory cells.

2. The semiconductor memory device according to claim 1, wherein each bit register is configured to record status information indicating whether the corresponding memory cell is defective.

3. The semiconductor memory device according to claim 2, wherein each bit register records data 0 if the corresponding memory cell is defective.

4. The semiconductor memory device according to claim 3, wherein the bit register has a fuse structure.

5. The semiconductor memory device according to claim 2, wherein each bit register records data 1 if the corresponding memory cell is defective.

6. The semiconductor memory device according to claim 5, wherein the bit register has an anti-fuse structure.

7. The semiconductor memory device according to claim 1, wherein the first bit registering layer includes a bit register corresponding to each memory cell for indicating the status of the corresponding memory cell; and
   the second bit registering layer includes a bit register corresponding to each memory cell for indicating the status of the corresponding memory cell.

8. The semiconductor memory device according to claim 7, wherein the status information indicates whether the memory cell is defective.

9. A semiconductor memory device comprising:
   a memory layer having memory cells for storing data; and
   at least two bit registering layers including first and second bit registering layers, each of the first and second bit registering layers configured to record status information on the memory cells and the at least two bit registering layers further including a plurality of bit registers, each bit register corresponding to one of the memory cells.

10. The semiconductor memory device according to claim 9, wherein each bit register is configured to record status information indicating whether the corresponding memory cell is defective.

11. The semiconductor memory device according to claim 9, wherein the bit register records status information indicating not to access the memory cell if the memory cell is defective.

12. The semiconductor memory device according to claim 11, wherein each bit register is a one-time programmable memory.

13. The semiconductor memory device according to claim 9, wherein at least one bit registering layer is formed over the memory layer.

14. The semiconductor memory device according to claim 9, wherein the memory layer is one of a molecular memory, a carbon nanotube memory, an atomic memory and a single electron memory.

15. The semiconductor memory device according to claim 9, wherein the memory layer includes nano-scale memory cells.

16. A method of accessing a semiconductor memory device having a plurality of memory cells, comprising:
   reading status information recorded in more than one bit register associated with a memory cell; and
   accessing the memory cell if the status information read from each associated bit register indicates the memory cell is not defective.

17. The method of claim 16, wherein the status information indicates whether the memory cell is defective; and the accessing step does not access the memory cell if the status information indicates the memory cell is defective.

18. The method of claim 16, wherein the accessing step includes reading data from the memory cell based on the status information.

19. The method of claim 16, wherein the accessing step includes writing data to the memory cell based on the status information.

20. A method of accessing a semiconductor memory device having a plurality of memory cells, comprising:
   reading status information recorded in more than one bit register associated with a memory cell; and
   accessing the memory cell if the status information read from at least one of the associated bit registers indicates the memory cell is not defective.

21. The method of claim 16, wherein the accessing step does not access the memory cell if the status information read from at least one of the associated bit registers indicates the memory cell is defective.

22. The method of claim 16, further comprising:
   testing whether each of the memory cells is defective; and
   recording the status information in the bit registers based on the testing results.

23. The method of claim 22, further comprising:
   configuring the bit register to indicate a defective memory cell if the bit register is defective.

* * * * *